United States Patent
Bukkems et al.

(10) Patent No.: US 10,443,795 B2
(45) Date of Patent: Oct. 15, 2019

(54) FLEXIBLE SOLID STATE LIGHTING STRIP

(71) Applicant: SIGNIFY HOLDING B.V., Eindhoven (NL)

(72) Inventors: Peter Johannes Martinus Bukkems, Eindhoven (NL); Johannes Petrus Maria Ansems, Eindhoven (NL); Anthonie Hendrik Bergman, Eindhoven (NL); Michel Cornelis Josephus Marie Vissenberg, Eindhoven (NL); Patrick Henricus Johannes Van Stijn, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/090,303

(22) PCT Filed: Apr. 20, 2017

(86) PCT No.: PCT/EP2017/059406
§ 371 (c)(1),
(2) Date: Oct. 1, 2018

(87) PCT Pub. No.: WO2017/186570
PCT Pub. Date: Nov. 2, 2017

(65) Prior Publication Data
US 2019/0113189 A1    Apr. 18, 2019

(30) Foreign Application Priority Data
Apr. 26, 2016   (EP) ..................... 16167081

(51) Int. Cl.
*F21S 4/22* (2016.01)
*H05K 1/02* (2006.01)
(Continued)

(52) U.S. Cl.
CPC .............. *F21S 4/22* (2016.01); *F21V 23/005* (2013.01); *H05K 1/028* (2013.01); *H05K 1/118* (2013.01);
(Continued)

(58) Field of Classification Search
None
See application file for complete search history.

(56) References Cited

U.S. PATENT DOCUMENTS

2009/0242263 A1   10/2009   Kapusta et al.
2011/0175533 A1*   7/2011   Holman ............... E04B 9/32
                                              315/130
(Continued)

FOREIGN PATENT DOCUMENTS

CN    202652681 U    1/2013

*Primary Examiner* — Ashok Patel
(74) *Attorney, Agent, or Firm* — Daniel J. Piotrowski (57) ABSTRACT

The present invention relates to a flexible solid state lighting strip (10), comprising: an elongate circuit board (12) having a longitudinal axis (14), wherein the elongate circuit board is bent, about folding lines (22; 26; 30; 34) parallel to the longitudinal axis of the elongate circuit board, into sections (18), such that subsequent sections along the longitudinal axis are oriented at least 45 degrees, preferably (approximately) 90 degrees, apart; and at least one solid state light source (44) mounted on the elongate circuit board.

13 Claims, 6 Drawing Sheets

(51) Int. Cl.
  *H05K 1/11* (2006.01)
  *H05K 1/18* (2006.01)
  *F21V 23/00* (2015.01)
  *F21S 4/26* (2016.01)
  *F21Y 115/10* (2016.01)
  *F21Y 107/70* (2016.01)
  *H05K 3/28* (2006.01)

(52) U.S. Cl.
  CPC ............... *H05K 1/189* (2013.01); *F21S 4/26* (2016.01); *F21Y 2107/70* (2016.08); *F21Y 2115/10* (2016.08); *H05K 3/284* (2013.01); *H05K 2201/055* (2013.01); *H05K 2201/10106* (2013.01)

(56) References Cited

U.S. PATENT DOCUMENTS

| | | |
|---|---|---|
| 2011/0228536 A1 | 9/2011 | Im et al. |
| 2012/0063139 A1 | 3/2012 | Benkart et al. |
| 2012/0287614 A1 | 11/2012 | Kajiya et al. |
| 2014/0268740 A1 | 9/2014 | Veres et al. |
| 2015/0117001 A1 | 4/2015 | Fan |
| 2015/0289358 A1 | 10/2015 | Park et al. |
| 2015/0354797 A1 | 12/2015 | Luo et al. |
| 2019/0128482 A1* | 5/2019 | Jiang ................. F21K 9/232 |

* cited by examiner

FLEXIBLE SOLID STATE LIGHTING STRIP

CROSS-REFERENCE TO PRIOR APPLICATIONS

This application is the U.S. National Phase application under 35 U.S.C. § 371 of International Application No. PCT/EP2017/059406, filed on Apr. 20, 2017 which claims the benefit of European Patent Application No. 16167081.5, filed on Apr. 26, 2016. These applications are hereby incorporated by reference herein.

FIELD OF THE INVENTION

The present intention relates to a flexible solid state lighting strip, such as a flexible LED (light emitting diode) strip.

BACKGROUND OF THE INVENTION

Present LED strips can be bent easily in one direction, see for example the stepwise curved lamp unit in FIGS. 1 and 2 of US 2011/0228536 (Im et al.). However, perpendicular to this direction one cannot bend the strip without running the risk of ruining the copper tracks. So, installing the strip goes well as long as the strip has to curve in one direction only.

In US 2015/0354797 a flexible circuit board is disclosed for an illumination device. The flexible circuit board includes a plurality of mounting sections for the LEDs and connection sections for mutual connecting adjacent mounting sections, so forming a longitudinal lighting device. The connection sections forming a predetermined angle in the longitudinal direction with respect to the mounting sections.

SUMMARY OF THE INVENTION

It is an object of the present invention to provide an improved flexible solid state lighting strip. It is a particular object of the present invention to provide a flexible solid state lighting strip which allows curving in at least in two (orthogonal) directions, without compromising its performance.

According to an aspect of the invention, these and other objects are achieved by a flexible solid state lighting strip, comprising: an elongate circuit board having a longitudinal axis, wherein the elongate circuit board is bent about folding lines parallel to the longitudinal axis of the elongate circuit board into sections, such that subsequent sections along the longitudinal axis are oriented at least 45 degrees apart; and at least one solid state light source mounted on the elongate circuit board.

The subsequent sections may for example be oriented 90 degrees or approximately 90 degrees apart. That is, every other section as seen in the longitudinal direction—is "turned" (approximately) 90 degrees about the longitudinal axis compared to the remaining sections. For example, the sections may alternately be horizontal and vertical. The terms 'approximately', 'substantially' and similar used herein may be construed as meaning that the angle referred to may be ±0-10 degrees or ±0-5 degrees.

Due to the elongate circuit board being bent into sections about folding lines which are parallel to the board's longitudinal axis such that longitudinally subsequent sections are oriented at least 45 degrees, preferably (approximately) 90 degrees, apart, the strip is flexible in two directions. This in turn makes the strip easier to mount in various applications.

The sections of the elongate circuit board may include a first section and a second section, wherein the elongate circuit board in a region where the first section and the second section are overlapping each other in the direction of the longitudinal axis of the elongate circuit board is bent about a first folding line of said folding lines such that the first section is perpendicular or substantially perpendicular to the second section.

The sections of the elongate circuit board may further include a third section in level with the second section in the direction of the longitudinal axis of the elongate circuit board, wherein the elongate circuit board is further bent 180 degrees or approximately 180 degrees about a second folding line of said folding lines, the second folding line joining said second and third sections, such that the second section is parallel or substantially parallel to the third section, and wherein the sections of the elongate circuit board further include a fourth section in level with the first section in the direction of the longitudinal axis of the elongate circuit board, wherein the elongate circuit board in a region where the third section and the fourth section are overlapping each other in the direction of the longitudinal axis of the elongate circuit board is bent about a third folding line of said folding lines such that the third section is perpendicular or substantially perpendicular to the fourth section and such that the first section and the fourth section are coplanar or substantially coplanar.

The sections of the elongate circuit board may further include another first section arranged in succession after the first section and the second section along the longitudinal axis of the elongate circuit board, wherein the elongate circuit board in a region where the second section and the another first section are overlapping each other in the direction of the longitudinal axis of the elongate circuit board is bent about a fourth folding line of said folding lines such that the second section is perpendicular or substantially perpendicular to the another first section and such that the first section and the another first section are coplanar or substantially coplanar.

The another first section can be followed by another second section, and so on. Likewise, the another second section can be joined with another third section which in turn is joined with to another fourth section (which is joined with to the aforementioned third section), and so one. To this end, it is appreciated that the present strip can comprise a long chain of first to fourth sections. Alternatively the present strip can comprise a long chain of only first and second sections. The latter may be beneficial from a manufacturing point of view.

The second section may have a free edge between the first folding line and the fourth folding line. The other sections may have analogous free edges.

The subsequent sections may each have an intermediate, non-overlapping region.

At least some of said sections of the elongate circuit board may each have the shape of an isosceles trapezoid. The isosceles trapezoid shape may be beneficial from a manufacturing point of view and for current transport. Alternatively, each section could be rectangular, for example.

Each of said sections of the elongate circuit board, at least when the flexible solid state lighting strip is not flexed, may be flat.

The elongate circuit board may comprise electrically conductive metal tracks.

The at least one solid state light source may comprises at least one solid state light source positioned on at least some of the sections of the elongate circuit board. In this way, the strip can be used to emit light is several different directions.

The at least one solid state light source may be positioned offset from a longitudinal mid of the sections of the elongate circuit board. As the at least one solid state light source typically is rigid, this placement may reduce the risk of damaging the solid state light source when the strip is flexed, since any bending of the sections when the strip is flexed is most likely to occur at the longitudinal mid of the respective section. Sections of the elongate circuit board may for example comprise two solid state light sources, one on each side of said longitudinal mid.

The flexible solid state lighting strip may further comprise material encapsulating the elongate circuit board and the at least one solid state light source. The material may be flexible. The material may for example be silicone or PUR (polyurethane). The encapsulating material can also be a material, for example a plastic, that is more elastic at elevated temperatures (i.e. above the operating temperature of the strip), and rigid when it is cold(er). When mounting the strip, such encapsulating material is heated, for example using a hair dryer or other heating device, so that the strip can be bent to the desired shape.

At least one hole may extend through the encapsulating material but not through the elongate circuit board. The at least one hole may be used to fixate the strip to some external structure, without using tape, glue or the like. Since the at least one hole does not pass through the elongate circuit board, a higher current can be used. The at least one hole also makes the strip easier to flex, i.e. make it more flexible. The at least one hole can conveniently be positioned at the aforementioned second and third sections, which keeps the strip smaller compared to other fixation solutions.

It is noted that the invention relates to all possible combinations of features recited in the claims.

BRIEF DESCRIPTION OF THE DRAWINGS

This and other aspects of the present invention will now be described in more detail, with reference to the appended drawings showing embodiments of the invention.

FIG. 1b is a partial side view of the flexible solid state lighting strip of FIG. 1a.

FIG. 1c is a partial top view of the flexible solid state lighting strip of FIG. 1a.

In the figures, like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1A:
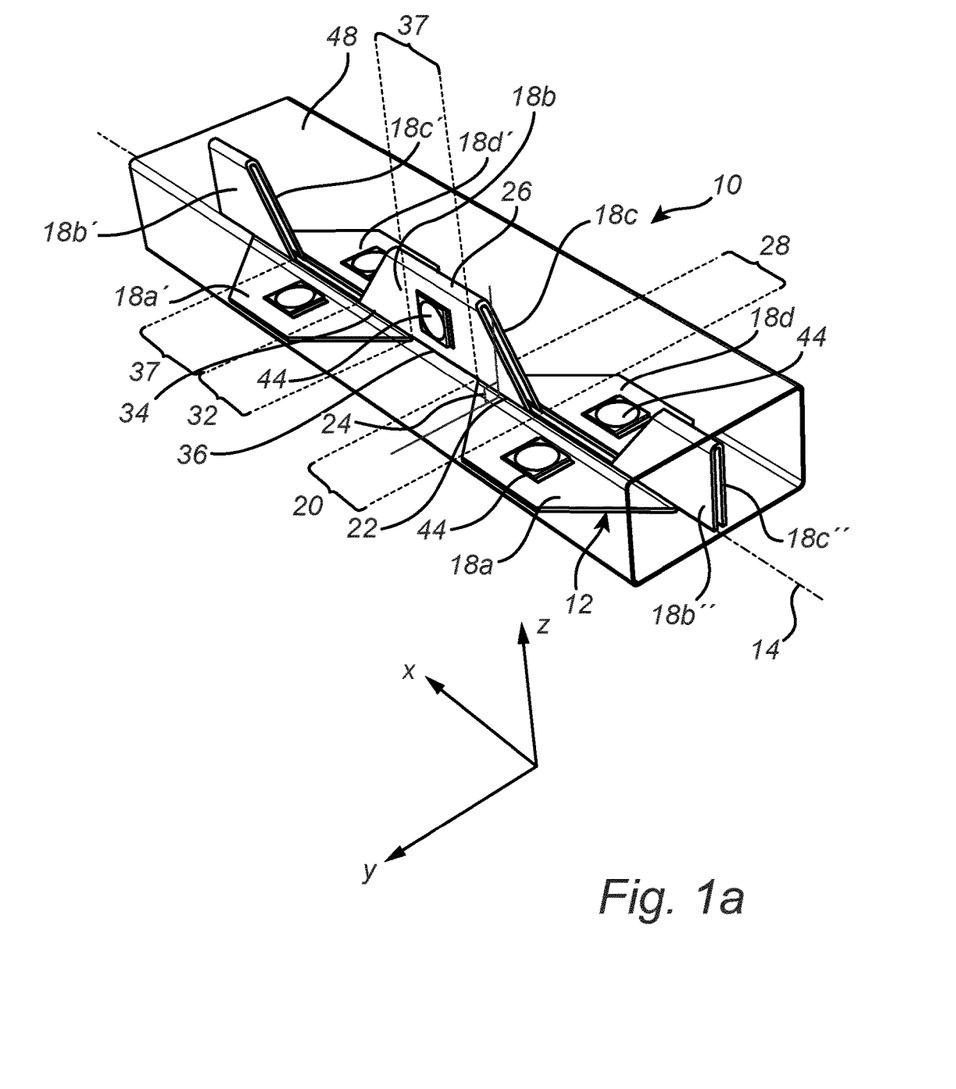
FIG. 1a is a partial perspective view of a flexible solid state lighting strip according to an embodiment of the present invention.
Figure 1B:
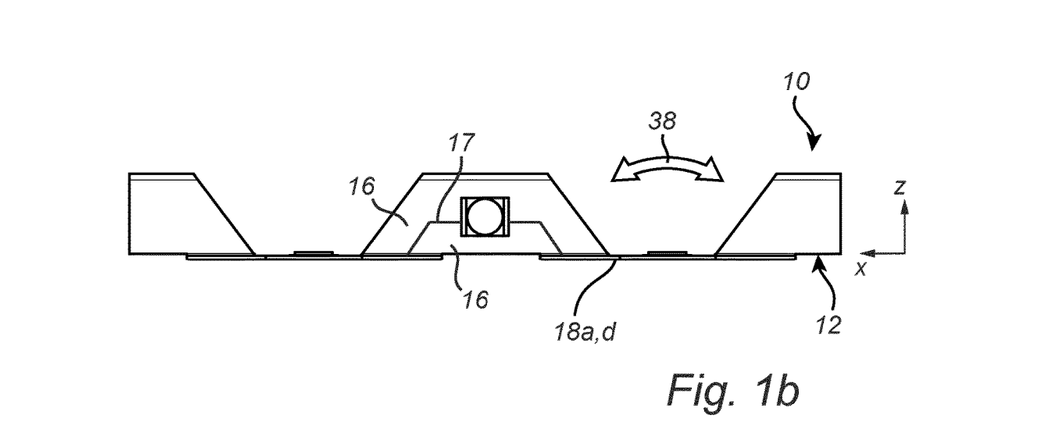
Figure 1C:
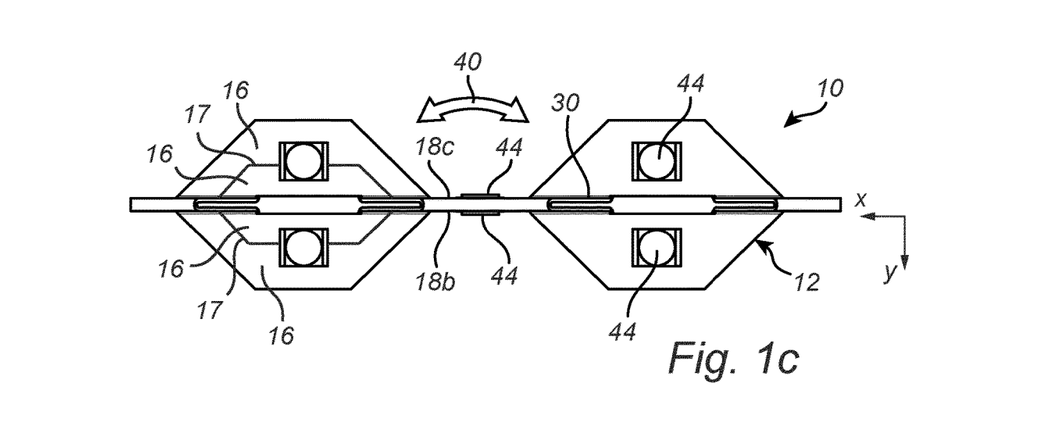

FIGS. 1a-c show a flexible solid state lighting strip 10 according to an embodiment of the present invention. For reference, a three dimensional Cartesian coordinate system with axis lines x, y and z is also shown.

The strip 10 comprises an elongate circuit board 12. The elongate circuit board 12 has a longitudinal axis 14 (x direction). The elongate circuit board 12 comprises a non-conductive substrate and electrically conductive metal tracks 16. The non-conductive substrate can for example be at least one foil made of polyamide. The electrically conductive metal tracks 16 can for example be copper. The metal tracks 16 in FIGS. 1b-c are separated by lines 17. The circuit board 12 can for example be a flexible printed circuit board (PCB). The thickness of the metal tracks 16 can for example be 0.01 mm or 0.035 mm or 0.07 mm, whereas the thickness of the polyamide foil can be 25 µm or 50 µm.

The elongate circuit board 12 is bent, during manufacturing of the strip 10, so that a plurality of (elongate circuit board) sections 18 are formed. As seen in the longitudinal direction, the strip 10 may for example have 100 sections or foldings per meter ("folding pitch"). Each section 18 has the shape of an isosceles trapezoid. To this end, each section 18 has a longer base, a shorter base, and two legs. Each section 18, at least when the strip 10 is not flexed, is flat. The sections 18 can have equal or different lengths.

The sections of the elongate circuit board 12 include a first section 18a and a second section 18b. The elongate circuit board 12 is bent, in a region 20 where the first section 18a and the second section 18b are overlapping each other in the direction of the longitudinal axis 14, about a first folding line 22. The first folding line 22 is parallel to the longitudinal axis 14, and extends along an end portion of the longer base of each section 18a-b. The elongate circuit board 12 is bent (approximately) 90 degrees about the first folding line 22 such that the first section 18a is (substantially) perpendicular to the second section 18b, as indicated by angle 24 in FIG. 1a.

The sections of the elongate circuit board 12 further include a third section 18c in level with the second section 18b in the direction of the longitudinal axis 14. That is, the second and third sections 18b-c have the same position in the x direction. The elongate circuit board 12 is further bent (approximately) 180 degrees about a second folding line 26 joining the shorter bases of sections 18b-c. The second folding line 26 is also parallel to the longitudinal axis 14. The elongate circuit board 12 is bent about the second folding line 26 such that the second section 18b is (substantially) parallel to the third section 18c.

The sections of the elongate circuit board 12 further include a fourth section 18d in level with the first section 18a in the direction of the longitudinal axis 14. Similar to the first and second sections 18a-b, the elongate circuit board 12 is bent, in a region 28 where the third section 18c and the fourth section 18d are overlapping each other in the direction of the longitudinal axis 14, about a third folding line 30. The third folding line 30 is parallel to the longitudinal axis 14, and extends along an end portion of the longer base of each section 18c-d. The elongate circuit board 12 is bent (approximately) 90 degrees about the third folding line 30 such that the third section 18c is (substantially) perpendicular to the fourth section 18d, whereby the first and fourth sections 18a,d are (substantially) coplanar.

The sections of the elongate circuit board 12 further include another first section 18a'. The another first section 18a' is arranged in succession after the first and second sections 18a-b along the longitudinal axis 14. The elongate circuit board 12 is bent, in a region 32 where the second section 18b and the another first section 18a' are overlapping each other in the direction of the longitudinal axis 14, about a fourth folding line 34. The fourth folding line 34 is parallel to the longitudinal axis 14, and extends along an end portion of the longer base of each section 18b and 18a'. The elongate circuit board 12 is bent about the fourth folding line 34 such that the second section 18b is (substantially) perpendicular to the another first section 18a', whereby the first section 18a and the another first section 18a' are (substantially) coplanar. The first section 18a and the another first section 18a' are also aligned in the x direction. Furthermore, as can be seen in FIGS. 1a-c, the longer base of the second section 18b has a free edge 36 between the first folding line 22 and the fourth folding line 34. Analogous free edges are provided on the other sections of the elongate circuit board 12 as well. Likewise, the second section 18b has a non-overlapping region 37 between regions 20 and 32. The other sections of the elongate circuit board 12 have corresponding non-overlapping regions 37.

The another first section 18a' is followed by another second section 18b' joined with another third section 18c' which in turn is joined with another fourth section 18d' joined with the aforementioned third section 18c, and so on. The strip 10 can comprise a long chain of first to fourth sections.

Hence, subsequent sections along the longitudinal axis 14, for example sections 18a-b, are oriented (approximately) 90 degrees apart, see angle 24 in FIG. 1a. Likewise, subsequent sections 18c-d, and subsequent sections 18b and 18a', for example, are oriented (approximately) 90 degrees apart.

Figure 2:
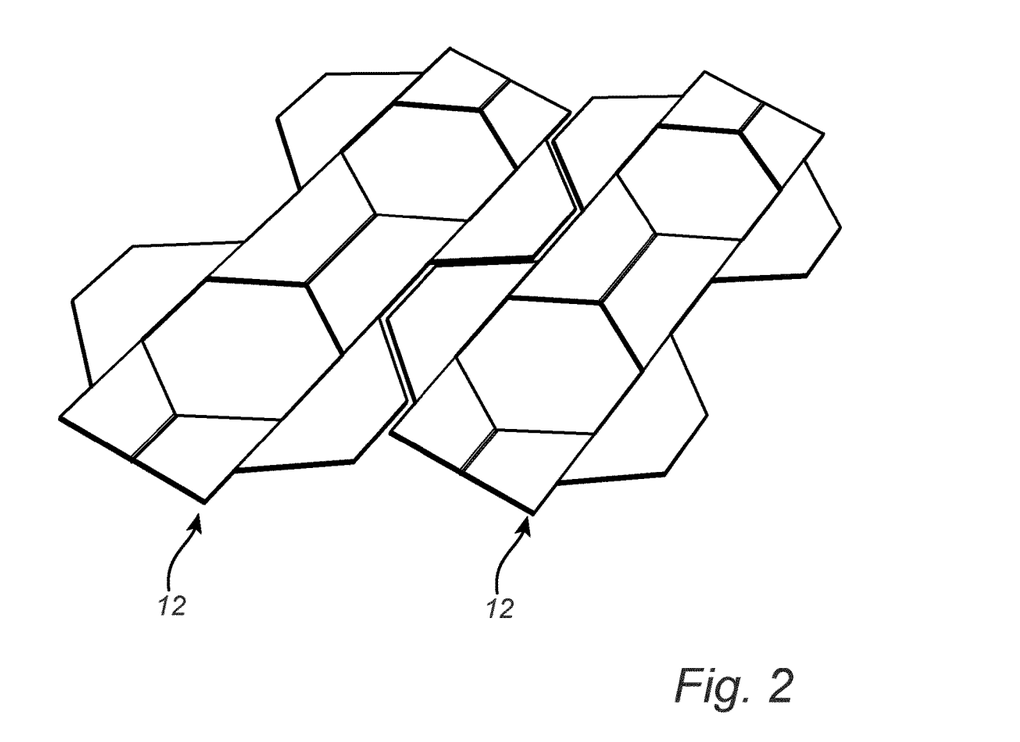
FIG. 2 is a perspective view of circuit boards used to manufacture flexible solid state lighting strips of the type shown in FIGS. 1a-c

As appreciated, the present strip 10 has "thin portions" both when seen from the side view (FIG. 1b; the first and fourth sections 18a,d are "thin" in this view) and when seen from the top view (FIG. 1c; the second and third sections 18b,c are "thin" in this view). This allows the strip 10 to be flexible in two orthogonal directions, as indicated by arrows 38 and 40 in FIGS. 1b-c. Conventional LED strips with rectangular circuit boards can be bent easily in only one direction (arrow 38). However, by the present folding of the elongate circuit board 12, the width of the circuit board 12 is locally reduced, whereby some portions of the strip 10 is weak in z direction and some in y direction. This, again, allows the strip 10 to be flexible in two directions. Furthermore, the elongate circuit board 12, before it is bent, provides for good flat pattern filling during manufacturing, see FIG. 2. The elongate circuit board 12 also provides for wide tracks for current transport.

Figure 3:
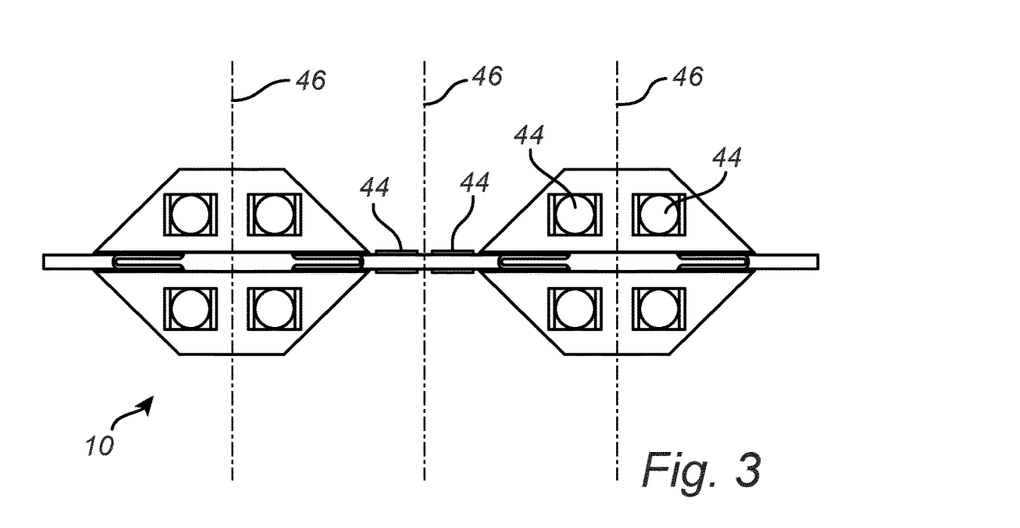
FIG. 3 is a partial top view of variant of the flexible solid state lighting strip of FIGS. 1a-c.

The strip 10 further comprises at least one solid state light source 44. The at least one solid state light source may for example be light-emitting diodes (LEDs), organic light-emitting diodes (OLEDs), or polymer light-emitting diodes (PLEDs). The at least one solid state light source 44 is connected to the electrically conductive metal tracks 16. In FIGS. 1a-c, the strip 10 comprises one solid state light source 44 centrally mounted on each section 18 of the elongate circuit board 12. In this way, the strip 10 can be used to emit light is several different directions, for example upwards and/or sideways (in one or two directions). However, one or more sections 18 could be provided without any solid state light source(s). That is, the solid state light source pitch may be lower than the folding pitch, which generally may be useful for high power strips and also make the strip more flexible. In a variant shown in FIG. 3, the solid state light sources 44 are positioned offset from a longitudinal mid 46 of each section 18. In particular, each section 18 may comprise two solid state light sources 44, one on each side of the longitudinal mid 46. Hence, in FIG. 3, the solid state light source pitch is greater than the folding pitch, which generally may be useful for low power strips. As the solid state light sources 44 typically are rigid, this placement may reduce the risk of damaging the solid state light source 44 when the strip 10 is flexed, since any bending of the sections 18 when the strip 10 is flexed is most likely to occur at the longitudinal mid 46 of the respective section.

Figure 4:
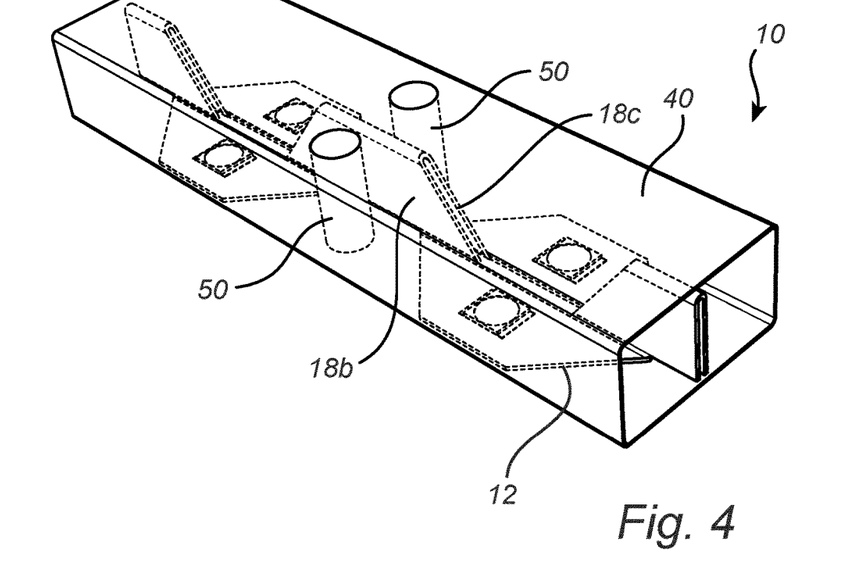
FIG. 4 is a partial perspective view of another variant of the flexible solid state lighting strip of FIGS. 1a-c.

The strip 10 may further comprise a flexible material 48 encapsulating the elongate circuit board 12 and the solid state light sources 44. The flexible material 48 may be transparent or translucent. The flexible material 48 may for example be silicone or PUR (polyurethane). The flexible material 48 may for example be formed like a homogenous, rectangular parallelepiped, as in FIG. 1a. In FIGS. 1b-c the flexible encapsulating material is now shown for brevity. In a variant shown in FIG. 4, at least one hole 50 extends through the flexible material 48, but not through the elongate circuit board 12. In particular, a first hole 50 is positioned at the second section 18b and a second hole 50 is positioned at the third section 18c, where the rectangular circuit board of a conventional LED strip normally would be present. The at least one hole 50 may be used to fixate the strip to some external structure, without using tape, glue or the like. Since the at least one hole 50 does not pass through the elongate circuit board 12, a higher current can be used. The at least one hole 50 also makes the strip 10 easier to flex, i.e. make it more flexible. Instead of a generally flexible material, the encapsulating material can be a material, for example a plastic, that is more elastic at elevated temperatures (i.e. above the operating temperature of the strip), and rigid when it is cold. Then, when mounting the strip, the encapsulating material is heated, for example using a hair dryer, so that the strip can be flexed to the desired shape.

Figure 5:
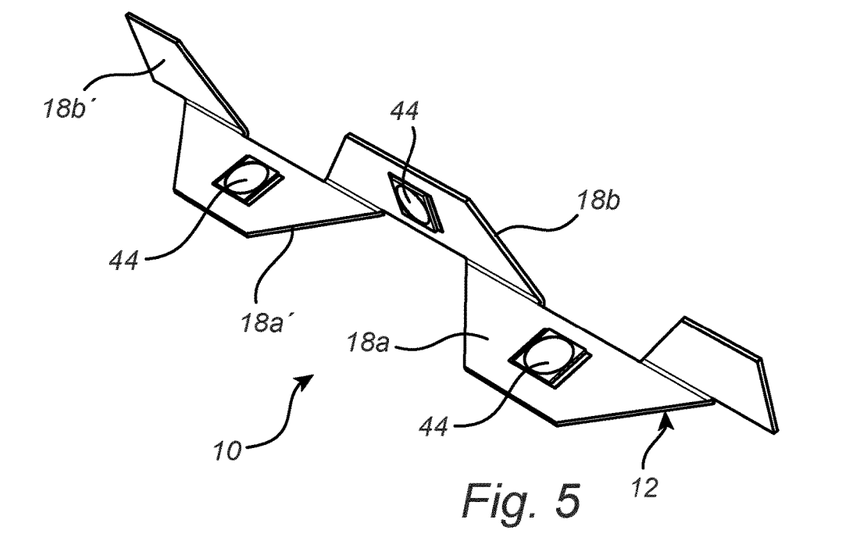
FIG. 5 is a partial perspective view of a flexible solid state lighting strip according to another embodiment of the present invention.
Figure 6:
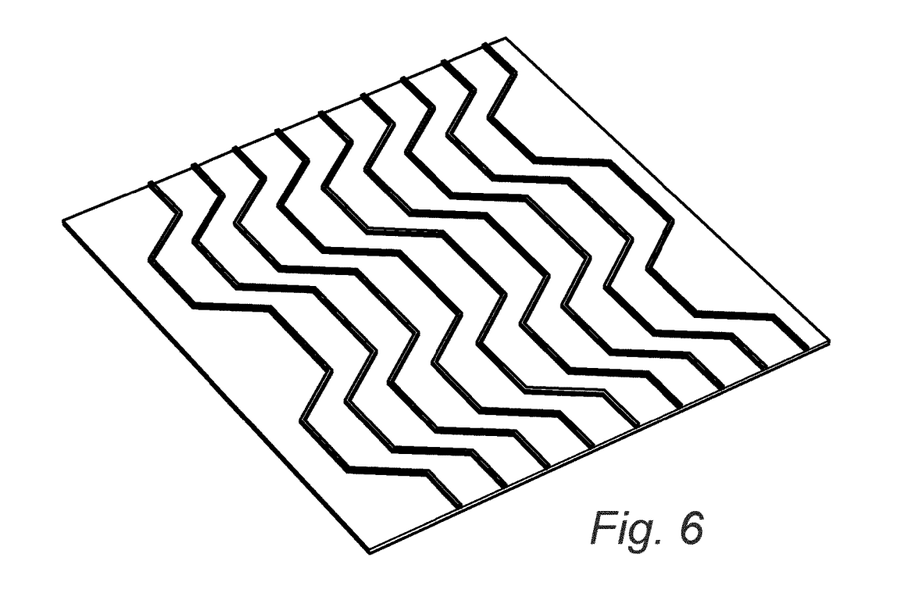
FIG. 6 is a perspective view of circuit boards used to manufacture flexible solid state lighting strips of the type shown in FIG. 5.

FIG. 5 shows a flexible solid state lighting strip 10 according to another embodiment of the present invention. The strip 10 in FIG. 5 only comprises first and second sections 18a-b, whereas the aforementioned third and fourth sections 18c-d are omitted. Hence, the strip 10 in FIG. 5 can comprise a long chain of first and second sections. Furthermore, the elongate circuit board 12 of this strip 10, before it is bent, provides for an improved flat pattern filling during manufacturing, see FIG. 6.

Figure 7:
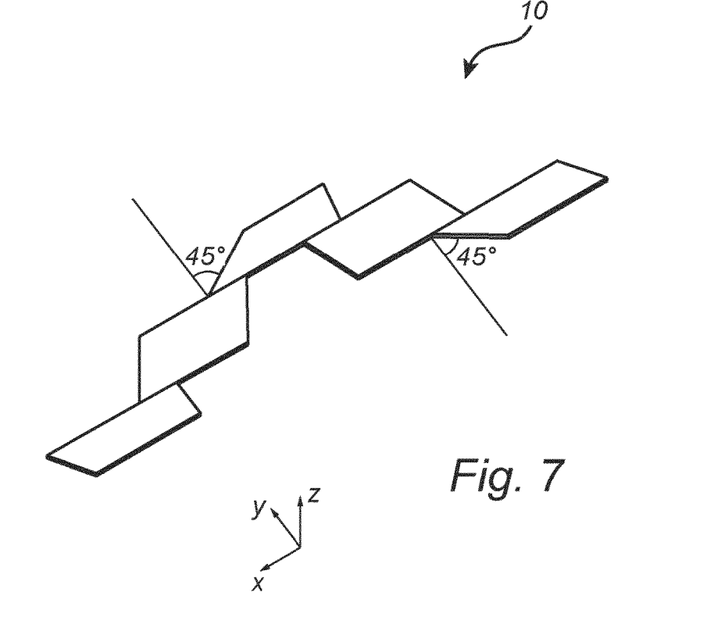
FIG. 7 is a partial perspective view of a flexible solid state lighting strip according to yet another embodiment of the present invention.

FIG. 7 shows a flexible solid state lighting strip 10 according to yet another embodiment of the present invention, wherein the elongate circuit board 12 is bent 45 degrees, whereby subsequent sections are oriented 45 degrees apart. Also, the sections 18 are here alternately isosceles trapezoid-shaped and parallelogram-shaped. Although this embodiment may be less flexible about the z axis (cf. arrow 40) than the other embodiments, it is more flexible than the conventional LED strips with rectangular circuit boards.

The strip of the present invention may be used in various lighting applications, such as LED lamps, LED systems, embedded lighting, etc.

Figure 8:
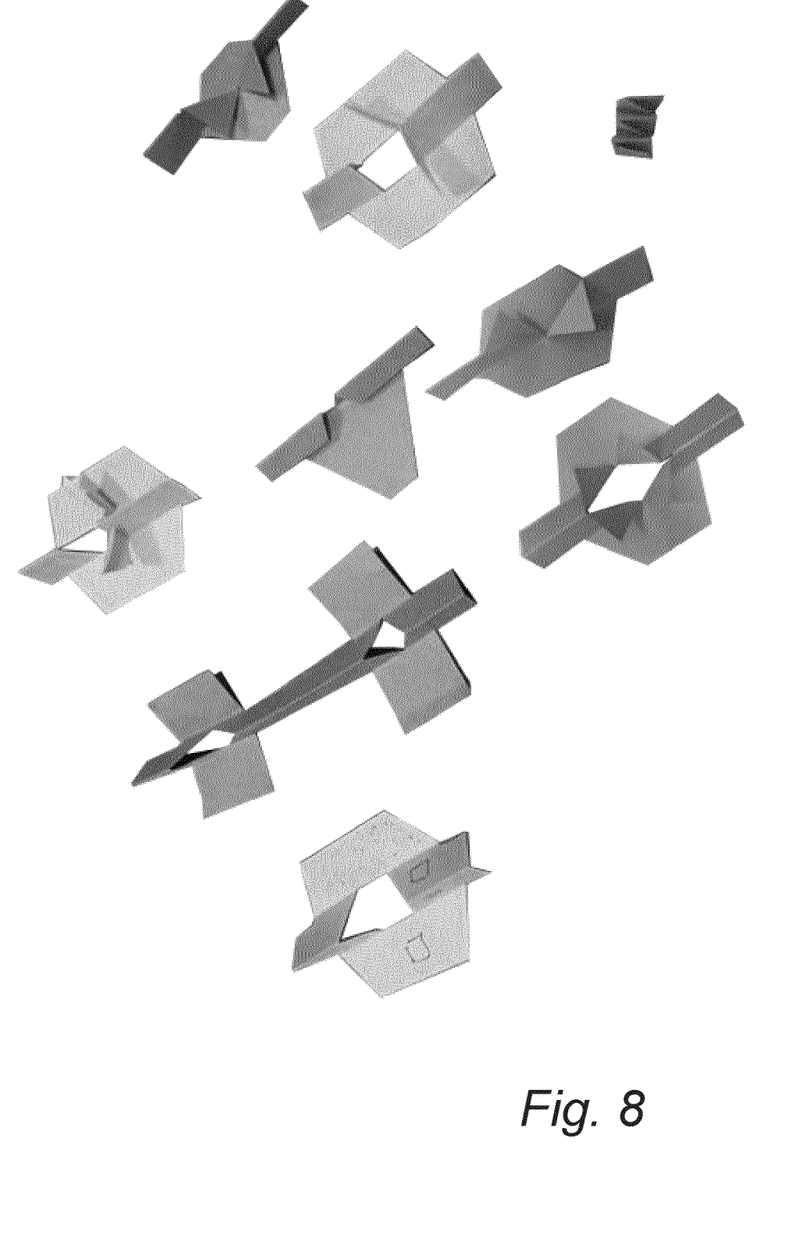
FIG. 8 shows different shapes to create more flexibility.

The person skilled in the art realizes that the present invention by no means is limited to the preferred embodiments described above. On the contrary, many modifications and variations are possible within the scope of the appended claims. For example, the dual light sources of FIG. 3 and/or the encapsulating material and at least one through hole of FIG. 4 could be used also in the embodiment shown in FIG. 5. Also, different shapes of the elongate circuit board to make the strip flexible in two directions are possible, as shown in FIG. 8.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A flexible solid state lighting strip, comprising:
   an elongate circuit board having a longitudinal axis, wherein the elongate circuit board is bent, about folding lines parallel to the longitudinal axis of the elongate circuit board, into sections, such that subsequent sections along the longitudinal axis are oriented at least 45 degrees apart; and
   at least one solid state light source mounted on the elongate circuit board, and
   wherein at least some of said sections of the elongate circuit board each has the shape of an isosceles trapezoid.

2. A flexible solid state lighting strip according to claim 1, wherein the subsequent sections are oriented 90 degrees or approximately 90 degrees apart.

3. A flexible solid state lighting strip according to claim 2, wherein the sections of the elongate circuit board include a first section and a second section, wherein the elongate circuit board in a region, where the first section and the second section are overlapping each other in the direction of the longitudinal axis of the elongate circuit board is bent about a first folding line of said folding lines such that the first section is perpendicular or substantially perpendicular to the second section.

4. A flexible solid state lighting strip according to claim 3, wherein the sections of the elongate circuit board further include a third section in level with the second section in the direction of the longitudinal axis of the elongate circuit board, wherein the elongate circuit board is further bent 180 degrees or approximately 180 degrees about a second folding line of said folding lines, the second folding line joining said second and third sections, such that the second section is parallel or substantially parallel to the third section, and wherein the sections of the elongate circuit board further include a fourth section in level with the first section in the direction of the longitudinal axis of the elongate circuit board, wherein the elongate circuit board in a region where the third section and the fourth section are overlapping each other in the direction of the longitudinal axis of the elongate circuit board is bent about a third folding line of said folding lines such that the third section is perpendicular or substantially perpendicular to the fourth section and such that the first section and the fourth section are coplanar or substantially coplanar.

5. A flexible solid state lighting strip according to claim 3, wherein the sections of the elongate circuit board further includes another first section arranged in succession after the first section and the second section along the longitudinal axis of the elongate circuit board, wherein the elongate circuit board in a region where the second section and the another first section are overlapping each other in the direction of the longitudinal axis of the elongate circuit board is bent about a fourth folding line of said folding lines such that the second section is perpendicular or substantially perpendicular to the another first section and such that the first section and the another first section are coplanar or substantially coplanar.

6. A flexible solid state lighting strip according to claim 5, wherein the second section has a free edge between the first folding line and the fourth folding line.

7. A flexible solid state lightening strip according to claim 1, wherein the subsequent sections each has an intermediate, non-overlapping region.

8. A flexible solid state lighting strip according to claim 1, wherein each of said sections of the elongate circuit board, at least when the flexible solid state lighting strip is not flexed, is flat.

9. A flexible solid state lighting strip according to claim 1, wherein the elongate circuit board comprises electrically conductive metal tracks.

10. A flexible solid state lighting strip according to claim 1, wherein said at least one solid state light source comprises at least one solid state light source positioned on at least some of the sections of the elongate circuit board.

11. A flexible solid state lighting strip according to claim 1, wherein said at least one solid state light source is positioned offset from a longitudinal mid of the sections of the elongate circuit board.

12. A flexible solid state lighting strip according to claim 1, further comprising material encapsulating the elongate circuit board and the at least one solid state light source.

13. A flexible solid state lighting strip according to claim 12, further comprising at least one hole extending through said material but not through the elongate circuit board.

* * * * *